US012771361B2

(12) United States Patent
Matsumoto

(10) Patent No.: US 12,771,361 B2
(45) Date of Patent: Oct. 20, 2026

(54) ATOMIC OSCILLATOR

(71) Applicant: NEC Corporation, Tokyo (JP)

(72) Inventor: Kenta Matsumoto, Tokyo (JP)

(73) Assignee: NEC CORPORATION, Tokyo (JP)

(*) Notice: Subject to any disclaimer, the term of this patent is extended or adjusted under 35 U.S.C. 154(b) by 0 days.

(21) Appl. No.: 19/039,878

(22) Filed: Jan. 29, 2025

(65) Prior Publication Data

US 2025/0274134 A1 Aug. 28, 2025

(30) Foreign Application Priority Data

Feb. 22, 2024 (JP) ................................ 2024-025365

(51) Int. Cl.
*H03L 7/26* (2006.01)

(52) U.S. Cl.
CPC ..................................... *H03L 7/26* (2013.01)

(58) Field of Classification Search
CPC ........................................................ H03L 7/26
USPC ........................................................ 331/94.1
See application file for complete search history.

(56) References Cited

U.S. PATENT DOCUMENTS

2019/0181871 A1* 6/2019 Matsuda ................. G04F 5/145
2020/0280319 A1* 9/2020 Onishi ...................... G04F 5/14
2023/0344189 A1* 10/2023 Olson .................. H01S 3/1303

FOREIGN PATENT DOCUMENTS

JP 2020-065148 A 4/2020

* cited by examiner

*Primary Examiner* — Richard Tan
(74) *Attorney, Agent, or Firm* — Sughrue Mion, PLLC

(57) ABSTRACT

An atomic oscillator of the present disclosure includes: a gas cell; a light generator irradiating the gas cell with irradiation light; a light detector detecting transmission light transmitted by the gas cell; a controller controlling an oscillation frequency based on a resonance frequency determined based on a light amount of the detected transmission light; and a temperature adjusting unit adjusting temperatures of the gas cell and the light generator. The temperature adjusting unit adjusts the temperatures of the gas cell and the light generator to set temperatures of the gas cell and the light generator, respectively, which are set so that an amount of change in resonance frequency when both the temperatures of the gas cell and the light generator change is smaller than an amount of change in resonance frequency when one of the temperatures of the gas cell and the light generator changes.

8 Claims, 6 Drawing Sheets

Fig.4

| | $T_{VCSEL}[1]$ | $T_{VCSEL}[2]$ | ··· | $T_{VCSEL}[N_V]$ |
|---|---|---|---|---|
| $T_{GC}[1]$ | $f_0[1,1]$<br>slope[1,1] | $f_0[1,2]$<br>slope[1,2] | ··· | $f_0[1,N_V]$<br>slope[1,$N_V$] |
| $T_{GC}[2]$ | $f_0[2,1]$<br>slope[2,1] | $f_0[2,2]$<br>slope[2,2] | ··· | $f_0[2,N_V]$<br>slope[2,$N_V$] |
| ··· | ··· | ··· | ··· | ··· |
| $T_{GC}[N_G]$ | $f_0[N_G,1]$<br>slope[$N_G$,1] | $f_0[N_G,2]$<br>slope[$N_G$,2] | ··· | $f_0[N_G,N_V]$<br>slope[$N_G$,$N_V$] |

ATOMIC OSCILLATOR

INCORPORATION BY REFERENCE

This application is based upon and claims the benefit of priority from Japanese patent application No. 2024-025365, filed on Feb. 22, 2024, the disclosure of which is incorporated herein in its entirety by reference.

TECHNICAL FIELD

The present disclosure relates to atomic oscillators.

BACKGROUND ART

As an oscillator with long-term high precision oscillation characteristics, an atomic oscillator that oscillates based on the energy transition of alkali metal atoms is known. The atomic oscillator determines a resonance frequency by detecting the transmission light amount of light applied to the atoms and controls an oscillation frequency based on the resonance frequency. In this case, in atomic oscillator, temperature fluctuations in the light source and gas cell that contains the atoms can cause the frequency stability of resonance frequency to be impaired. For this reason, Patent Literature 1 describes keeping temperature of the light source and gas cell constant.

Patent Literature 1: Japanese Unexamined Patent Application Publication No. JP-A 2020-065148

However, in an atomic oscillator, it is difficult to control the temperature of the light source and the gas cell to keep them constant. For example, when the temperature changes in a short period of time, it is difficult to control the temperature of the light source and the gas cell to keep them constant in response to the temperature change. This causes a problem that it is difficult to improve the stability of the resonant frequency in the atomic oscillator.

SUMMARY OF INVENTION

An object of the present disclosure is to solve the above-mentioned problem that it is difficult to improve the stability of the resonance frequency in an atomic oscillator.

An atomic oscillator as an aspect of the present invention includes: a gas cell in which alkali metal atoms are encapsulated: a light generator that irradiates the gas cell with irradiation light having at least two different frequency components: a light detector that detects transmission light transmitted by the gas cell: a controller that determines a resonance frequency based on a light amount of the detected transmission light and controls an oscillation frequency of an output signal based on the determined resonance frequency; and a temperature adjusting unit that adjusts a temperature of the gas cell and a temperature of the light generator. The temperature adjusting unit adjusts, based on a temperature and resonance frequency relation in each of the gas cell and the light generator, the temperature of the gas cell and the temperature of the light generator to a set temperature of the gas cell and a set temperature of the light generator, respectively, which are set so that an amount of change in resonance frequency when both the temperature of the gas cell and the temperature of the light generator change is smaller than an amount of change in resonance frequency when either the temperature of the gas cell or the temperature of the light generator changes.

Further, a control method as an aspect of the present disclosure is a control method by an atomic oscillator. The atomic oscillator includes: a gas cell in which alkali metal atoms are encapsulated; a light generator that irradiates the gas cell with irradiation light having at least two different frequency components; and a light detector that detects transmission light transmitted by the gas cell. The control method includes: determining a resonance frequency based on a light amount of the detected transmission light; and controlling to adjust, based on a temperature and resonance frequency relation in each of the gas cell and the light generator, the temperature of the gas cell and the temperature of the light generator to a set temperature of the gas cell and a set temperature of the light generator, respectively, which are set so that an amount of change in resonance frequency when both the temperature of the gas cell and the temperature of the light generator change is smaller than an amount of change in resonance frequency when either the temperature of the gas cell or the temperature of the light generator changes.

With the configurations as described above, the present disclosure can improve the stability of the resonance frequency in an atomic oscillator.

BRIEF DESCRIPTION OF DRAWINGS

FIG. 4 is a view showing an aspect of processing by the atomic oscillator;

EXAMPLE EMBODIMENTS

First Example Embodiment

A first example embodiment of the present disclosure will be described with reference to the drawings. The drawings can relate to any of the example embodiments.

[Configuration]

Figure 2:
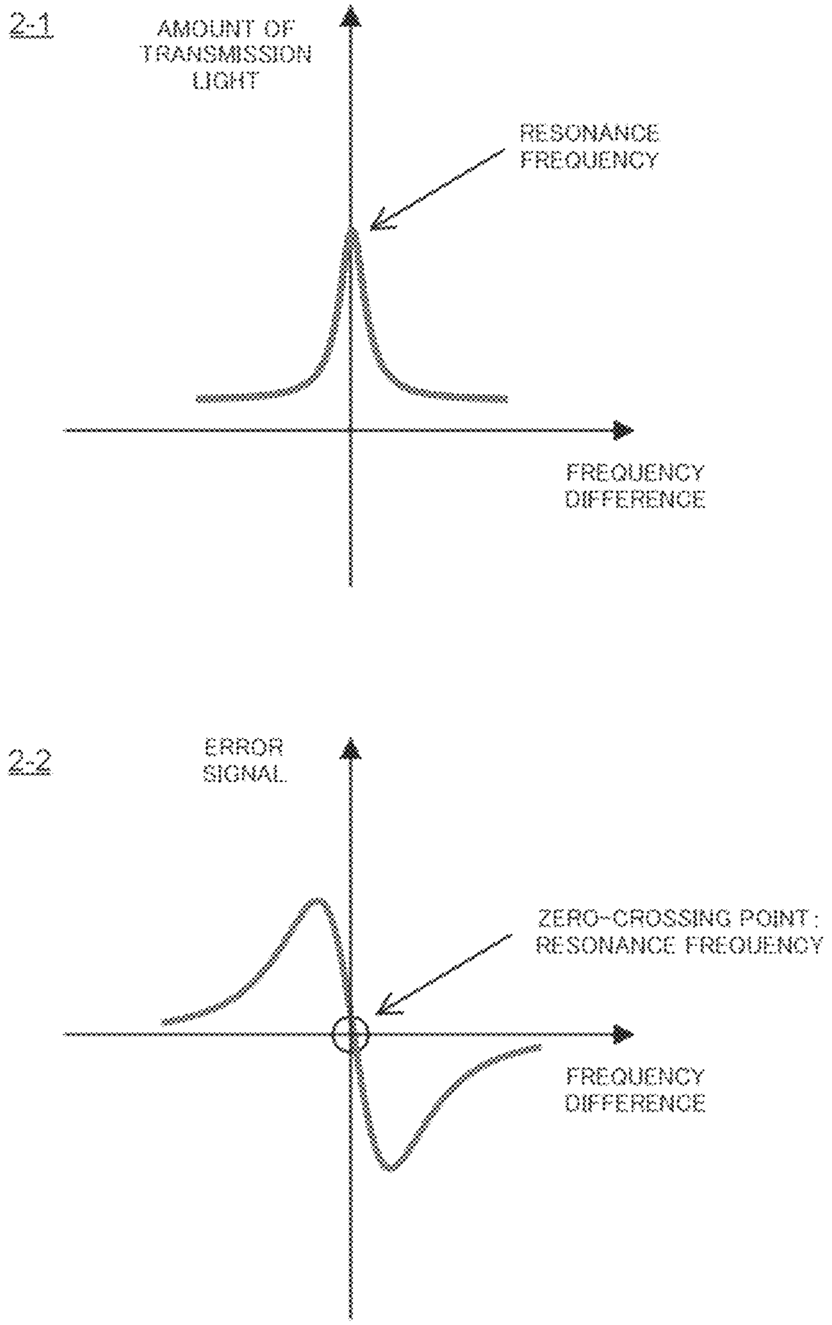
FIG. 2 is a view showing an aspect of processing by the atomic oscillator.

First, the outline of an atomic oscillator will be described. An atomic oscillator is a device that realizes stable frequency oscillation by utilizing an atomic gas of alkali metal atoms and the like. An atomic oscillator has a gas cell in which an atomic gas is encapsulated. By irradiating the gas cell with light containing at least two different frequencies and measuring transmission light thereof, the atomic oscillator can detect a quantum interference effect (called CPT (Coherent Population Trapping) resonance) that occurs when the transition frequency between specific quantum states of the atomic gas matches the frequency difference of the irradiation light, as a change of the amount of transmission light. FIG. 2 is a view of the CPT resonance appearing in a transmission light spectrum. For example, in the case of measuring a transmission light spectrum when light transmitted by cesium atoms is detected while sweeping the frequency difference of irradiation light, when the frequency difference matches the transition frequency between specific quantum states, the amount of the transmission light reaches a peak value and CPT resonance is detected as shown in FIG. 2 (2-1). The frequency difference of the irradiation light at this time is called a resonance frequency. By detecting the resonance frequency of the CPT resonance and controlling the frequency difference of the irradiation light to match the transition frequency between the specific quantum states, a high-precision atomic oscillator utilizing the quantum interference effect can be realized. In the atomic oscillator utilizing CPT described above, the resonance frequency of the CPT resonance is used as the reference for the oscillation frequency.

A transmission light spectrum is expressed as a Lorentzian function centered on the transition frequency between quantum states, where a point at which the amount of transmission light is maximized is generally the resonance frequency of the CPT resonance and used as the reference for the oscillation frequency. As an example, by sweeping the frequency difference of light applied at the time of starting the atomic oscillator, it is possible to acquire an error signal of a transmission light spectrum as shown in a schematic view of FIG. 2 (2-2), and set the zero-crossing of the error signal as the resonance frequency and set as the reference for the oscillation frequency. The error signal of the transmission light spectrum can be acquired, for example, by modulating the frequency difference of the irradiation light with a reference frequency of a period shorter than the sweep period of the frequency difference at the time of sweeping the frequency difference, and performing lock-in detection on the detected amount of transmission light with the reference frequency.

The amount of change in the error signal at the zero-crossing point, which is the resonance frequency, i.e., the ratio of the amount of fluctuation in the error signal to the amount of deviation between the frequency difference and the resonance frequency, is called the zero-point slope. When monitoring the error signal, the greater the absolute value of the zero-point slope, the higher the detection sensitivity of the difference between the frequency difference and the resonance frequency.

Then, after detecting the resonance frequency using the zero-crossing in the above manner as an initialization process, the atomic oscillator constantly monitors the zero-crossing and feeds back by the amount of deviation from the zero crossing to the control signal of an oscillation device, and can thereby increase the stability of an output frequency.

Figure 1:
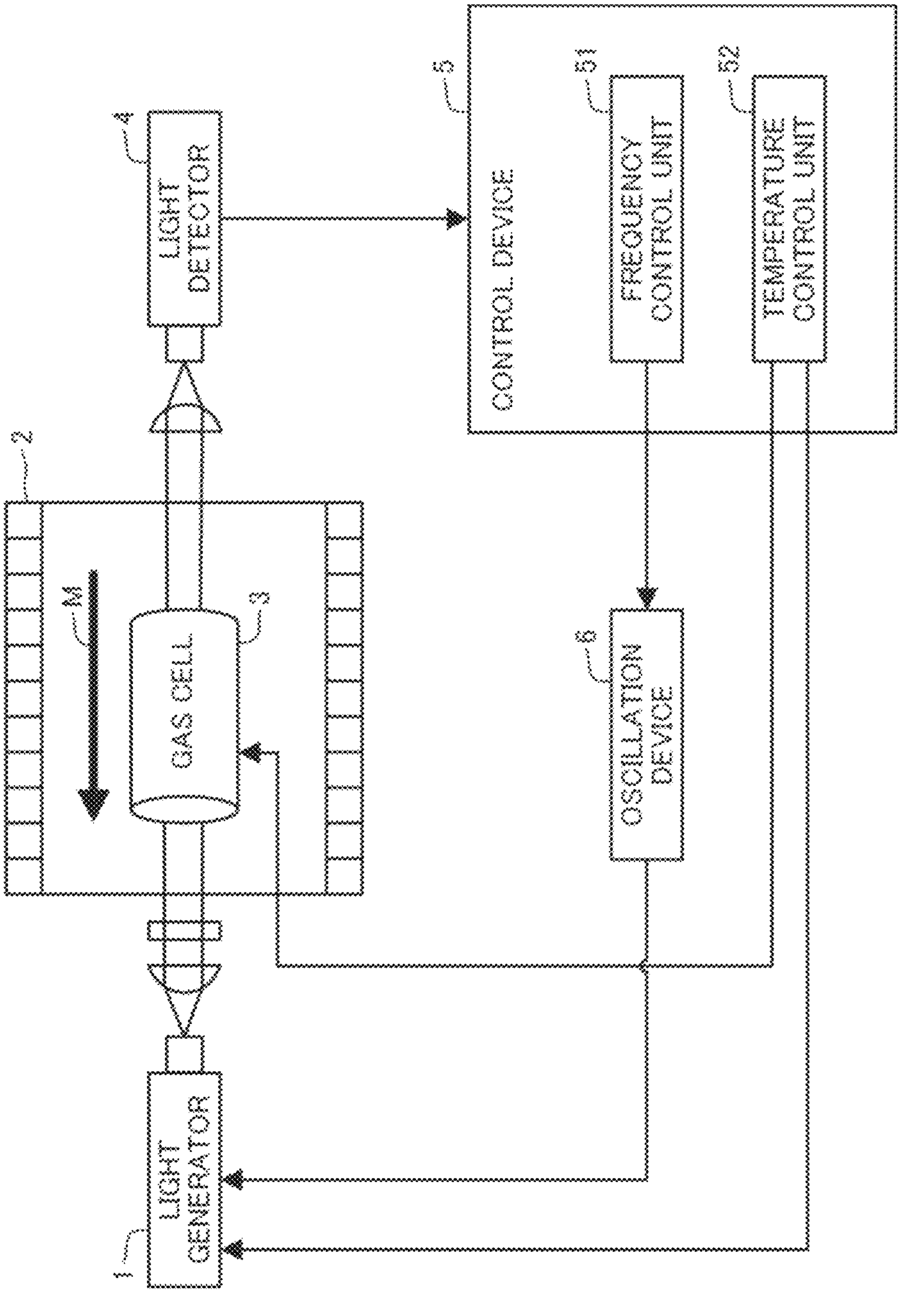
FIG. 1 is a block diagram showing the configuration of an atomic oscillator in the present disclosure.

Next, the configuration of the atomic oscillator in this embodiment will be described. As shown in FIG. 1, the atomic oscillator includes a light generator 1, a magnetic field application device 2, a gas cell 3 in which alkali metal atoms or the like are sealed in a gaseous state, a light detector 4, a control device 5, and an oscillation device 6. Here, the control device 5 is configured as an information processing device including a calculation device and a storage device. As shown in FIG. 1, the control device 5 includes a frequency control unit 51 and a temperature control unit 52 that are constructed by the calculation device executing a program. Among these, at least the gas cell 3 and the light generator 4 are housed in one housing (not shown).

The light generator 1 generates light having at least two different frequencies. Irradiation light, which is the light generated by the light generator 1, is applied onto the gas cell 3, and transmission light, which is light transmitted by the gas cell 3, reaches the light detector 4 and is detected, converted into an electric signal or the like and sent to the control device 5. Moreover, the light generator 1 is configured so that the wavelength of light to be generated, the intensity of the light for each frequency component, and the frequency difference are controlled based on a control signal from the control device 5 as will be described later.

The irradiation light that is the light generated by the light generator 1 has at least two different frequency components. Although the light emitted by the light generator 1 may have three or more different frequency components, the frequency difference between two of the frequency components is approximately equal to the transition frequency between specific quantum states forming the CPT resonance of alkali metal atoms. For example, the light generated by the light generator 1 is realized by generating sidebands by modulating single-wavelength light oscillating from a semiconductor laser or the like with a frequency that is approximately equal to the transition frequency of an alkali metal atom or 1/N times the transition frequency, where N is an integer. At this time, the control of the frequency difference is realized by a mechanism that controls the modulation frequency. Alternatively, the light generated by the light generator 1 is realized by multiplexing two single wavelength lights oscillating from two semiconductor lasers or the like having a mechanism controlling the frequency difference.

Specifically, in this embodiment, the light generator 1 is configured to include a vertical cavity surface emitting laser (VCSEL) as a light source element that generates excitation light of a single wavelength, and two excitation lights are generated by performing frequency modulation from the excitation light of the single wavelength. The VCSEL, which is the light source element, is equipped with a temperature adjustment device (temperature adjustment unit) for the light source that adjusts its own temperature. The temperature adjustment device for the light source adjusts the temperature of the VCSEL to a set temperature in response to a control command by the temperature control unit 52 that specifies the set temperature for the light source, as described later. The temperature adjustment device for the light source is configured, for example, by a resistance heater, but may be configured by any device as long as it has a function of heating or heating/cooling and can adjust the temperature of the VCSEL.

The magnetic field application device 2 generates a magnetic field M in a direction parallel or antiparallel to the irradiation light at a predetermined position inside the gas cell 3. The magnetic field application device 2 is, for example, a coil arranged to cover the gas cell 3, and the control of the direction and strength of a static magnetic field applied to a predetermined position inside the gas cell 3 is realized by regulating the direction and magnitude of an electric current applied to the coil.

In the gas cell 3, alkali metal atoms are encapsulated. The alkali metal atoms encapsulated in the gas cell 3 may be, for example, any of cesium atoms, rubidium atoms, sodium atoms, and potassium atoms. A material constituting the container of the gas cell 3 is preferably a transparent material such as glass that has a high transmittance for the irradiation light generated by the light generator 1. In the gas cell 3, in addition to the alkali metal atoms, a buffer gas that does not contribute to absorption of the irradiation light may be encapsulated in order to reduce the effect of collisions between the container wall surface and the gaseous alkali metal atoms.

The gas cell 3 is also equipped with a gas cell temperature regulator (temperature regulator) that regulates its own temperature. The gas cell temperature regulator regulates the temperature of the gas cell 3 to a set temperature in response to a control command from the temperature control unit 52, which specifies a set temperature for the gas cell, as described below. The gas cell temperature regulator is provided so as not to block the optical path of the irradiated light, and is composed of, for example, a resistance heater. However, the temperature regulator may be composed of any device as long as it has a heating or heating/cooling function and can regulate the temperature of the gas cell 3.

The light detector 4 has a device that detects transmission light, which is light transmitted by the gas cell 3. The light detector 4 is, for example, realized by using a photodiode, and can be realized by a photodetector that is a light detecting means. Information of the light detected by the light detector 4 is converted into an electric signal or the like and input to the control device 5.

As an initiation process at the time of starting the atomic oscillator and the like, the frequency controller 51 included by the control device 5 determines the resonance frequency in the abovementioned manner from the amount of the transmission light input by the light detector 4, and controls an oscillation frequency from the oscillation device 6 based on the determined resonance frequency. Specifically, the frequency controller 51 sweeps the frequency difference of the irradiation light, determines the resonance frequency from the transmission light spectrum, and, once determining the resonance frequency, regulates a control voltage for the oscillation device 6 so that the error signal of the lock-in detected transmission light spectrum is at a predetermined signal level. Here, the oscillation device 6 is configured with a VCXO (voltage controlled crystal oscillator) that oscillates at about 10 MHz, and the oscillation device 6 generates an oscillation signal in accordance with a control voltage output and applied by the frequency controller 51, and outputs the oscillation signal as an oscillation frequency that is the external output of the atomic oscillator. Consequently, the oscillation frequency is stabilized at 10 MHz as long as the resonance frequency does not change. Moreover, the frequency difference of the irradiation light is generated by converting the oscillation signal of the VCXO into a signal of several GHz by the multiplier 7 and is input to the light generator 1.

The temperature control unit 52 included in the control device 5 has a function of issuing control commands specifying set temperatures to the temperature adjustment device equipped in the VCSEL of the light generator 1 and the temperature adjustment device equipped in the gas cell 3, and adjusting the temperatures of the VCSEL and the gas cell 3. At this time when performing a process of determining a control target value for the temperatures of the VCSEL and the gas cell 3 during the initialization process, as described later, the temperature control unit 52 controls to adjust the temperatures of the VCSEL and the gas cell 3 by specifying multiple set temperatures within a predetermined range. Furthermore, during operation after the resonance frequency is determined by the initialization process, the temperature control unit 52 controls to adjust the temperatures of the VCSEL and the gas cell 3 using the set temperature set by the initialization process as a control target value, as described later.

Figure 3:
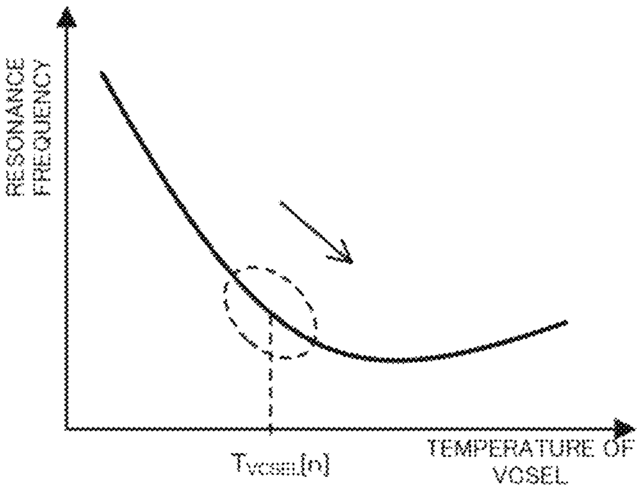
FIG. 3 is a view showing an aspect of processing by the atomic oscillator.
Figure 3:
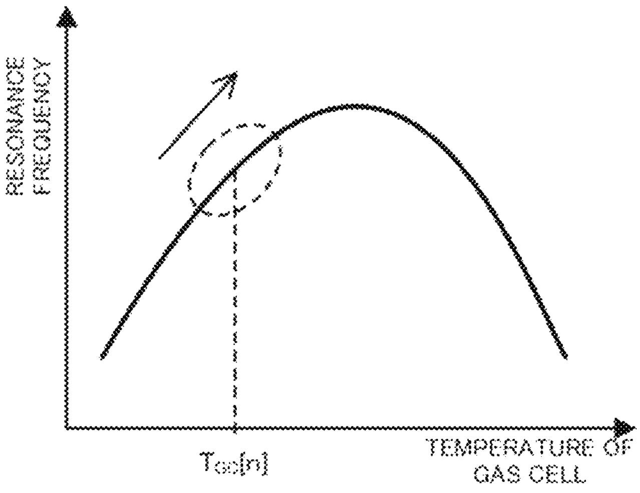

Here, the frequency control unit 51 further has a temperature setting function (temperature setting unit) for setting a light source set temperature that is a control target value of the temperature of the VCSEL, which is a light source provided in the light generating unit 1, and a gas cell set temperature that is a control target value of the temperature of the gas cell 3 during the above-mentioned initialization process. At this time, the temperature setting function of the frequency control unit 51 stores relationship data such as a graph showing the relationship between the temperature of the VCSEL and the resonant frequency and a graph showing the relationship between the temperature of the gas cell and the resonant frequency as shown in FIG. 3, and sets each set temperature using such relationship data. FIG. 3 (3-1) shows the characteristics of the resonant frequency fluctuation with respect to the temperature fluctuation of the VCSEL, and the example of FIG. 3 (3-2) shows the characteristics of the resonant frequency fluctuation with respect to the temperature fluctuation of the gas cell 3. Note that the relationship data shown in FIG. 3 is an example, and the characteristics of the resonant frequency fluctuation with respect to the temperature fluctuation of the VCSEL or the gas cell 3 may be any characteristics, and are not necessarily limited to being data in a graph format. The temperature setting function of the frequency control unit 51 will be described in detail below.

The temperature setting function of the frequency control unit 51 first sets a plurality of combinations of the VCSEL temperature and the gas cell 3 temperature within a predetermined temperature range. For example, as shown in the table of FIG. 4, a plurality of combinations of the VCSEL temperature "$T_{VCSEL}$" and the gas cell 3 temperature "$T_{GC}$" are set, such as ($T_{VCSEL}$" [1], $T_{GC}$ [1]), ($T_{VCSEL}$" [2], $T_{GC}$ [2]) . . . ($T_{VCSEL}$" [$N_V$], $T_{GC}$ [$N_G$]). Then, the temperature setting function controls the VCSEL and the gas cell 3 to have the temperature of each combination by the temperature control unit 52, acquires a resonance signal at the temperature of each combination of the VCSEL and the gas cell 3, and acquires the resonance frequency "$f_0$" and the zero-point slope "slope". As an example, as shown in the table of FIG. 4, for the temperature combination ($T_{VCSEL}$" [1], $T_{GC}$ [1]), the resonance frequency "$f_0$ [1,1]" and the zero-point slope "slope [1,1]" are obtained, and for each of the other temperature combinations, the resonance frequency "$f_0$" and the zero-point slope "slope" are obtained. Note that, as shown in FIG. 2 (2-2), the zero-point slope is a value that represents the amount of change in the error signal of the spectrum of the transmitted light when the frequency difference of the irradiated light matches the transition frequency between specific quantum states. In other words, the zero point slope is a value that represents the amount of change in the error signal at the resonance frequency, that is, the slope, and the steeper the slope, the larger the absolute value. Note that, the steeper the slope of the zero-point slope, the better the detection sensitivity of the resonance frequency fluctuation.

Next, the temperature setting function checks the characteristics of the amount of change in the resonant frequency when the temperatures of the VCSEL and the gas cell change for each of the above-mentioned combinations. Specifically, the temperature setting function checks the amount of change in the resonant frequency with respect to the temperature change of the VCSEL at the temperature of the combination, "$df_0/dT_{VCSEL}$," expressed by Equation 1, and the amount of change in the resonant frequency with respect to the temperature change of the gas cell 3 at the temperature of the combination, "$df_0/dT_{GC}$," expressed by Equation 2, using the above-mentioned relationship data as shown in FIG. In particular, the temperature setting function checks the positive/negative sign of the amount of change in the resonant frequency.

$$\frac{df_0}{dT_{VCSEL}} \quad \text{[Equation 1]}$$

$$\frac{df_0}{dT_{GC}} \quad \text{[Equation 2]}$$

As an example, when the temperature of the combination is ($T_{VCSEL}$ [n], $T_{GC}$ [n]), the relationship data in FIG. 3 is used to check the amount of change in the resonant frequency with respect to the change in the temperature of the VCSEL and the amount of change in the resonant frequency with respect to the change in the temperature of the gas cell 3, which are the values respectively shown in the above Equations 1 and 2. It is found that the amount of change in the resonant frequency with respect to the change in the temperature of the VCSEL has a "negative" sign as shown by the arrow, and the amount of change in the resonant frequency with respect to the change in the temperature of the gas cell 3 has a "positive" sign as shown by the arrow.

temperature setting function stores, in association with each combination of temperature set as described above, resonance frequency "$f_0$" and zero-point slope "slope" obtained for each combination of temperature, and fluctuation amount of resonance frequency with respect to temperature fluctuation of the VCSEL and gas cell 3 examined for each combination of temperature.

Next, the temperature setting function extracts, as a candidate temperature, a combination of temperatures that satisfies the set condition based on the stored amount of change in the resonant frequency with respect to the temperature change of the VCSEL and the gas cell 3 from among the combinations of temperatures set as shown in FIG. 4. Specifically, the temperature setting function extracts, as a candidate temperature, a combination of temperatures in which the amount of change in the resonant frequency with respect to the temperature change of the VCSEL and the amount of change in the resonant frequency with respect to the temperature change of the gas cell 3 are opposite in sign to each other. For example, in the temperature combination ($T_{VCSEL}$ [n], $T_{GC}$ [n]) in the example shown in FIG. 3, the amount of change in the resonant frequency with respect to the temperature change of the VCSEL and the gas cell 3 is "negative" and "positive", respectively, so this combination of temperatures is extracted as a candidate temperature. In this way, for example, a plurality of combinations of temperatures can be extracted as candidate temperatures, such as "($T_{VCSEL}[i_1]$, $T_{GC}[j_1]$), ($T_{VCSEL}[i_2]$, $T_{GC}[j_2]$), . . . ".

After that, the temperature setting function determines one temperature combination from the extracted candidate temperatures as the control target value. At this time, temperature setting function determines the candidate temperature for which the absolute value of the associated and stored zero-point slope "slope [i, j]" is maximum as the setting temperature, which is the control target value ($T_{VCSEL}[i]$, $T_{GC}[j]$) of temperature of each of the VCSEL and gas cell 3.

Here, the combination of set temperatures, which are the control target values determined as described above, can be said to be set temperatures that are set so as to reduce the fluctuation amount in the resonance frequency when the temperatures of the VCSEL and the gas cell 3 fluctuate. This will be described below.

First, when the environmental temperature "$T_{env}$" at the installation location of the atomic oscillator fluctuates, the temperatures "$T_{VCSEL}$" and "$T_{GC}$" of the VCSEL and gas cell 3 of the light generator 1 mounted on the atomic oscillator also fluctuate. Then, the resonance frequency "$f_0$" also fluctuates due to the characteristics of the resonance frequency with respect to the temperature of the VCSEL and gas cell 3 of the light generator 1 as shown in FIG. 3. At this time, the fluctuation "$df_0/dT_{env}$" of the resonance frequency "$f_0$" with respect to the fluctuation of the environmental temperature "$T_{env}$" can be expressed as the following Equation 3 using the temperatures "$T_{VCSEL}$" and "$T_{GC}$" of the VCSEL and gas cell 3. Note that "$X_i$" is a control parameter.

$$\frac{df_0}{dT_{env}}\left(=\sum_i \frac{dX_i}{dT_{env}}\frac{df_0}{dX_i}\right) \cong \frac{dT_{VCSEL}}{dT_{env}}\frac{df_0}{dT_{VCSEL}} + \frac{dT_{GC}}{dT_{env}}\frac{df_0}{dT_{GC}} \quad \text{[Equation 3]}$$

Here, in order to realize frequency stability of the atomic oscillator, it is desirable to make the fluctuation "$df_0/dT_{env}$" of the resonance frequency "$f_0$" with respect to the fluctuation of the environmental temperature "$T_{env}$" shown in the Equation 3 smaller, for example, closer to 0. At this time, since it is difficult to make "$dT_{VCSEL}/dT_{env}$" and "$dT_{GC}/dT_{env}$" in the above Equation 3 closer to 0, the Equation 4 is realized by a combination of "$df_0/dT_{VCSEL}$" and "$df_0/dT_{GC}$".

$$\frac{dT_{VCSEL}}{dT_{env}}\frac{df_0}{dT_{VCSEL}} + \frac{dT_{GC}}{dT_{env}}\frac{df_0}{dT_{GC}} \cong 0 \quad \text{[Equation 4]}$$

In order to realize the above Equation 4, it is sufficient that the amount of change in the resonant frequency with respect to the temperature change of the VCSEL "$df_0/dT_{VCSEL}$" and the amount of change in the resonant frequency with respect to the temperature change of the gas cell 3 "$df_0/dT_{GC}$" cancel each other out. Therefore, it is sufficient that the amount of change in the resonant frequency of the VCSEL "$df_0/dT_{VCSEL}$" and the amount of change in the resonant frequency of the gas cell 3 "$df_0/dT_{GC}$" have opposite signs. This allows the increase in the amount of change in one resonant frequency to be reduced by the amount of change in the other resonant frequency. For example, when the outside air temperature (the temperature outside the housing) of the atomic oscillator changes suddenly, it is often considered that a temporary deviation in the temperature control of the gas cell and the VCSEL housed in the same housing occurs at the same time. In this case, even if an increase in the amount of fluctuation in one resonant frequency occurs, if the amount of fluctuation in the other resonant frequency can be simultaneously decreased, the sum of these (Equation 4) can be kept close to 0 even if a sudden change in outside air temperature occurs.

Operation

Next, the operation of the above mentioned atomic oscillator will be described. When the atomic oscillator is started up, during the initialization process, the control device 5 performs processing to set the set temperature, which is the control target value for temperature, using the temperature setting function.

Figure 5:
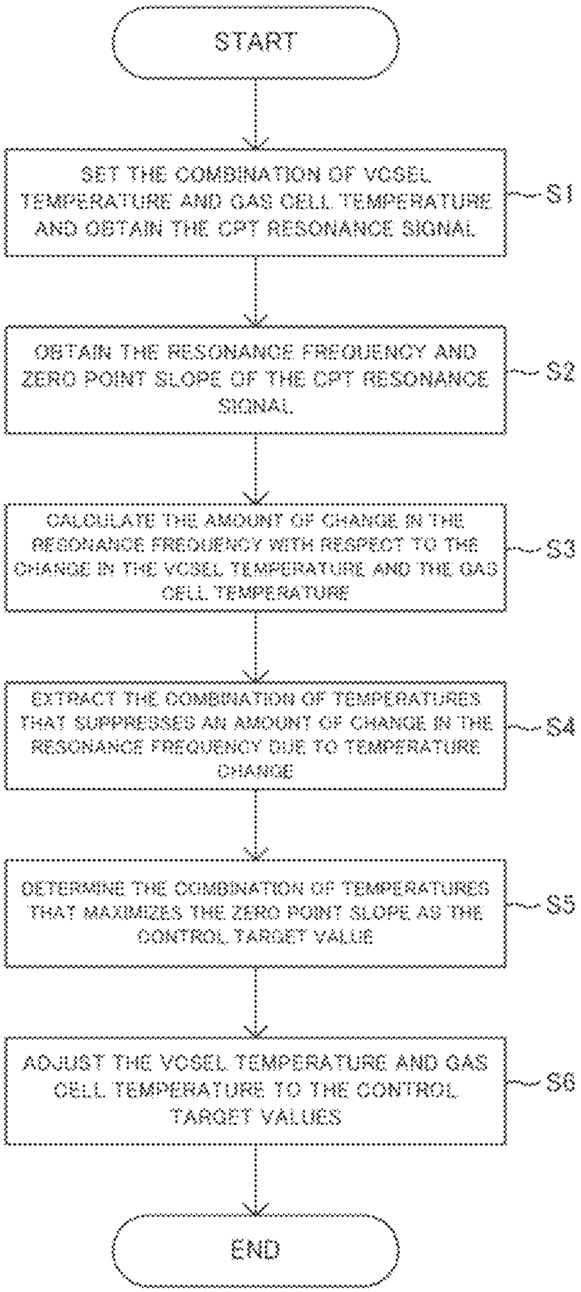
FIG. 5 is a flowchart showing processing operation by the atomic oscillator.

Specifically, the temperature setting function first sets a plurality of combinations of the VCSEL temperature and the gas cell 3 temperature in a predetermined temperature range (step S1 in FIG. 5). For example, as shown in the table in FIG. 4, a plurality of combinations of the VCSEL temperature "$T_{VCSEL}$" and the gas cell 3 temperature "$T_{GC}$" are set, such as ($T_{VCSEL}[1]$, $T_{GC}[1]$), ($T_{VCSEL}[2]$, $T_{GC}[2]$), . . . , ($T_{VCSEL}[N_V]$, $T_{GC}[N_G]$). Then, the temperature setting function controls the VCSEL and the gas cell 3 to have the temperature of each combination by the temperature control unit 52, and obtains the CPT resonance signal at the temperature of each combination of the VCSEL and the gas cell 3 (step S2 in FIG. 5).

Next, the temperature setting function acquires the resonance frequency "$f_0$" and the zero-point slope "slope" from the CPT resonance signal acquired at each combination of temperatures (step S2 in FIG. 5). In addition, the temperature setting function checks the amount of change in the resonance frequency when the temperatures of the VCSEL and the gas cell change at each combination of temperatures. Specifically, the temperature setting function uses the above-mentioned relationship data as shown in FIG. 3 to check the amount of change in the resonance frequency "$df_0/dT_{VCSEL}$" relative to the temperature change of the VCSEL at the temperature of the combination, and the amount of change in the resonance frequency "$df_0/dT_{GC}$" relative to the temperature change of the gas cell 3 at the temperature of the combination, which is expressed by Equation 2 (step S3 in FIG. 5). At this time, in particular, the temperature setting function checks the positive and negative signs of the amount of change in the resonance frequency.

The temperature setting function extracts, as a candidate temperature, a combination of temperatures that satisfies a set condition based on the stored amount of change in the resonant frequency with respect to the temperature change of the VCSEL and the gas cell 3 from among the combinations of temperatures set as shown in FIG. 4. In particular, the temperature setting function extracts, as a candidate temperature, a combination of temperatures in which the amount of change in the resonant frequency with respect to the temperature change of the VCSEL and the amount of change in the resonant frequency with respect to the temperature change of the gas cell 3 are opposite in sign to each other (step S4 in FIG. 5). For example, in the combination of temperatures ($T_{VCSEL}$[n], $T_{GC}$[n]) in the example shown in FIG. 3, the amount of change in the resonant frequency with respect to the temperature change of the VCSEL and the gas cell 3 are "negative" and "positive", respectively, so such a combination of temperatures is extracted as a candidate temperature. It can be said that the temperature of such a combination is a set temperature that is set so that the amount of change in the resonant frequency when the temperatures of both the VCSEL and the gas cell 3 change is smaller than the amount of change in the resonant frequency when either one of the temperatures of the VCSEL or the gas cell 3 changes. In other words, by setting the VCSEL and the gas cell to such temperatures, an increase in the amount of variation in the resonant frequency due to a temperature change in one can be reduced by the amount of variation in the resonant frequency due to a temperature change in the other.

Next, the temperature setting function determines one combination of temperatures from the extracted candidate temperatures as the control target value. At this time, the temperature setting function determines the candidate temperature at which the absolute value of the associated and stored zero-point slope "slope[i,j]" is maximum as the set temperature that is the control target value ($T_{VCSEL}$[i], $T_{GC}$[j]) of the temperature of each of the VCSEL and the gas cell 3 (step S5 in FIG. 5).

Then, the temperature control unit 52 of the control device 5 controls the temperature of the VCSEL and the gas cell 3 to be adjusted with the set temperature determined as described above as the control target value (step S6 in FIG. 5). As a result, even if the temperatures of the VCSEL and the gas cell 3 fluctuate due to a change in the external environmental temperature, the amount of fluctuation in the resonant frequency can be suppressed to a small amount, and frequency stability can be improved.

The process of determining the control target values of the temperatures of the VCSEL and the gas cell 3 described above is not limited to being performed during the initialization process, and may be performed at any timing, such as at regular time intervals.

Second Example Embodiment

Next, a second example embodiment of the present invention will be described with reference to FIG. 6. The drawings can relate to any of the example embodiments.

Figure 6:
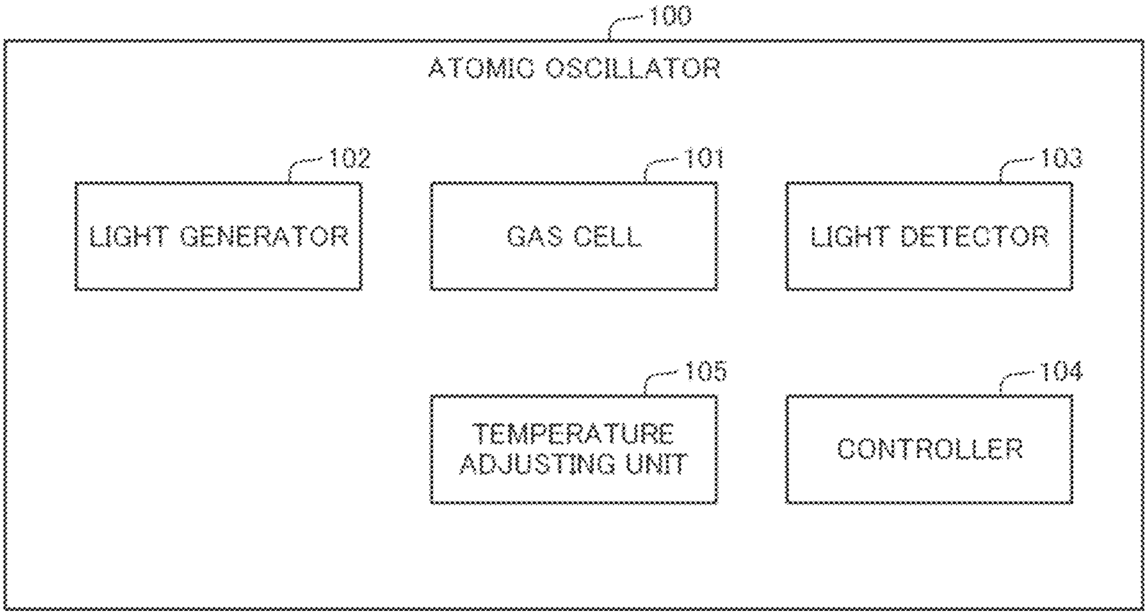
FIG. 6 is a block diagram showing the configuration of a second atomic oscillator in the present disclosure.

As shown in FIG. 6, an atomic oscillator 100 in this example embodiment includes:

- a gas cell 101 in which alkali metal atoms are encapsulated;
- a light generator 102 that irradiates the gas cell with irradiation light having at least two different frequency components;
- a light detector 103 that detects transmission light transmitted by the gas cell;
- a controller 104 that determines a resonance frequency based on a light amount of the detected transmission light and controls an oscillation frequency of an output signal based on the determined resonance frequency; and
- a temperature adjusting unit 105 that adjusts a temperature of the gas cell and a temperature of the light generator.

Then, the temperature adjusting unit 105 adjusts, based on a temperature and resonance frequency relation in each of the gas cell and the light generator, the temperature of the gas cell and the temperature of the light generator to a set temperature of the gas cell and a set temperature of the light generator, respectively, which are set so that an amount of change in resonance frequency when both the temperature of the gas cell and the temperature of the light generator change is smaller than an amount of change in resonance frequency when either the temperature of the gas cell or the temperature of the light generator changes.

In the atomic oscillator 100 of this example embodiment, by adjusting the temperatures of the gas cell 101 and the light generator 102 to the above mentioned set temperatures, even if temperature fluctuations occur in the gas cell 101 and the light generator 102 due to the external environmental temperature or the like, the fluctuation amount in the resonance frequency due to such temperature fluctuations is reduced, thereby improving frequency stability.

Although the present disclosure has been described above with reference to the above example embodiments and so forth, the present disclosure is not limited to the above example embodiments. The configuration of the present disclosure can be changed in various manners that can be understood by one skilled in the art within the scope of the present disclosure.

Supplementary Notes

The whole or part of the example embodiments disclosed above can be described as the following supplementary notes. Below, the overview of the configurations of an atomic oscillator and a control method in the present disclosure will be described. However, the present invention is not limited to the following configurations.

(Supplementary Note 1)

An atomic oscillator comprising:

a gas cell in which alkali metal atoms are encapsulated;

a light generator that irradiates the gas cell with irradiation light having at least two different frequency components;

a light detector that detects transmission light transmitted by the gas cell;

a controller that determines a resonance frequency based on a light amount of the detected transmission light and controls an oscillation frequency of an output signal based on the determined resonance frequency; and a temperature adjusting unit that adjusts a temperature of the gas cell and a temperature of the light generator, wherein the temperature adjusting unit adjusts, based on a temperature and resonance frequency relation in each of the gas cell and the light generator, the temperature of the gas cell and the temperature of the light generator to a set temperature of the gas cell and a set temperature of the light generator, respectively, which are set so that an amount of change in resonance frequency when both the temperature of the gas cell and the temperature of the light generator change is smaller than an amount of change in resonance frequency when either the temperature of the gas cell or the temperature of the light generator changes.

(Supplementary Note 2)

The atomic oscillator according to Supplementary Note 1, wherein the temperature adjusting unit adjusts, based on the relation, the temperature of the gas cell and the temperature of the light generator to a set temperature of the gas cell and a set temperature of the light generator, respectively, which are set so as to reduce an amount of change in resonance frequency when the temperature of the gas cell changes by an amount of change in resonance frequency when the temperature of the light generator changes.

(Supplementary Note 3)

The atomic oscillator according to Supplementary Note 1, wherein the temperature adjusting unit adjusts, based on the relation, the temperature of the gas cell and the temperature of the light generator to a set temperature of the gas cell and a set temperature of the light generator, respectively, which are set so that an amount of change in resonance frequency due to a change in temperature of the gas cell and an amount of change in resonance frequency due to a change in temperature of the light generator have mutually opposite signs.

(Supplementary Note 4)

The atomic oscillator according to Supplementary Note 1, wherein:

the controller includes a temperature setting unit that sets a plurality of combinations of the temperature of the gas cell and the temperature of the light generator, determines a resonance frequency for each of the plurality of combinations, extracts a combination in which an amount of change in resonance frequency due to a change in temperature of the gas cell and an amount of change in resonance frequency due to a change in temperature of the light generator have mutually opposite signs from among the plurality of combinations based on the relation, and sets the set temperature of the gas cell and the set temperature of the light generator based on the extracted combination; and the temperature adjusting unit adjusts the temperature of the gas cell and the temperature of the light generator to the set temperature of the gas cell and the set temperature of the light generator, respectively.

(Supplementary Note 5)

The atomic oscillator according to Supplementary Note 4, wherein the temperature setting unit determines a resonance frequency for each of the plurality of combinations, acquires a zero-point slope that represents an amount of change in error signal of a spectrum of the transmission light when a frequency difference of the irradiation light coincides with a transition frequency between specific quantum states, and sets the set temperature of the gas cell and the set temperature of the light generator based on the extracted combination and the zero point slope.

(Supplementary Note 6)

The atomic oscillator according to Supplementary Note 5, wherein the temperature setting unit sets a combination having a maximum absolute value of the zero-point slope among the extracted combination as the set temperature of the gas cell and the set temperature of the light generator.

(Supplementary Note 7)

A control method by an atomic oscillator, the atomic oscillator including:

a gas cell in which alkali metal atoms are encapsulated;

a light generator that irradiates the gas cell with irradiation light having at least two different frequency components; and a light detector that detects transmission light transmitted by the gas cell, the control method comprising:

determining a resonance frequency based on a light amount of the detected transmission light; and controlling to adjust, based on a temperature and resonance frequency relation in each of the gas cell and the light generator, the temperature of the gas cell and the temperature of the light generator to a set temperature of the gas cell and a set temperature of the light generator, respectively, which are set so that an amount of change in resonance frequency when both the temperature of the gas cell and the temperature of the light generator change is smaller than an amount of change in resonance frequency when either the temperature of the gas cell or the temperature of the light generator changes.

(Supplementary Note 8)

The control method according to Supplementary Note 7, comprising setting a plurality of combinations of the temperature of the gas cell and the temperature of the light generator, determining a resonance frequency for each of the plurality of combinations, extracting a combination in which an amount of change in resonance frequency due to a change in temperature of the gas cell and an amount of change in resonance frequency due to a change in temperature of the light generator have mutually opposite signs from among the plurality of combinations based on the relation, and setting the set temperature of the gas cell and the set temperature of the light generator based on the extracted combination; and adjusting the temperature of the gas cell and the temperature of the light generator to the set temperature of the gas cell and the set temperature of the light generator, respectively.

DESCRIPTION OF REFERENCE NUMERALS

1 light generator
2 magnetic field application device
3 gas cell
4 light detector
5 control device
51 frequency control unit
52 temperature control unit
6 oscillation device
100 atomic oscillator
101 gas cell
102 light generator
103 light detector
104 controller
105 temperature adjusting unit

The invention claimed is:

1. An atomic oscillator comprising:
a gas cell in which alkali metal atoms are encapsulated;
a light generator configured to irradiate the gas cell with irradiation light having at least two different frequency components;
a light detector configured to detect transmission light transmitted by the gas cell;
a controller configured to:
determine a resonance frequency of the alkali metal atoms in the gas cell based on a light amount of the detected transmission light; and
control an oscillation frequency of the atomic oscillator based on the resonance frequency; and
a temperature adjusting unit configured to adjust a temperature of the gas cell and a temperature of the light generator,
wherein the temperature adjusting unit is further configured to, based on a relation among: the temperature of the gas cell, the temperature of the light generator, and the resonance frequency, adjust the temperature of the gas cell and the temperature of the light generator to a set temperature of the gas cell and a set temperature of the light generator, respectively, which are set so that an amount of change in the resonance frequency when both the temperature of the gas cell and the temperature of the light generator change is smaller than: an amount of change in the resonance frequency when the temperature of the gas cell changes, or an amount of change in the resonance frequency when the temperature of the light generator changes.

2. The atomic oscillator according to claim 1, wherein
the temperature adjusting unit is further configured to adjust, based on the relation, the temperature of the gas cell and the temperature of the light generator to the set temperature of the gas cell and the set temperature of the light generator, respectively, which are set so as to reduce the amount of change in the resonance frequency when the temperature of the gas cell changes by the amount of change in the resonance frequency when the temperature of the light generator changes.

3. The atomic oscillator according to claim 1, wherein
the temperature adjusting unit is further configured to adjust, based on the relation, the temperature of the gas cell and the temperature of the light generator to the set temperature of the gas cell and the set temperature of the light generator, respectively, which are set so that the amount of change in the resonance frequency due to a change in the temperature of the gas cell and the amount of change in the resonance frequency due to a change in the temperature of the light generator have mutually opposite signs.

4. The atomic oscillator according to claim 1, wherein:
the controller comprises a temperature setting unit configured to:
set a plurality of combinations of the temperature of the gas cell and the temperature of the light generator,
determine a resonance frequency of the alkali metal atoms in the gas cell for each of the plurality of combinations,
extract, based on the relation and from the plurality of combinations, a combination in which an amount of change in the resonance frequency due to a change in the temperature of the gas cell and an amount of change in the resonance frequency due to a change in the temperature of the light generator have mutually opposite signs, and
set the set temperature of the gas cell and the set temperature of the light generator based on the extracted combination; and
the temperature adjusting unit is further configured to adjust the temperature of the gas cell and the temperature of the light generator to the set temperature of the gas cell and the set temperature of the light generator, respectively.

5. The atomic oscillator according to claim 4, wherein
the temperature setting unit is further configured to:
determine the resonance frequency for each of the plurality of combinations;
acquire a zero-point slope that represents an amount of change in error signal of a spectrum of the transmission light when a frequency difference of the irradiation light coincides with a transition frequency between specific quantum states; and
set the set temperature of the gas cell and the set temperature of the light generator based on the extracted combination and the zero-point slope.

6. The atomic oscillator according to claim 5, wherein
the temperature setting unit is further configured to set a combination having a maximum absolute value of the zero-point slope among the extracted combination as the set temperature of the gas cell and the set temperature of the light generator.

7. A control method by an atomic oscillator, the atomic oscillator comprising:
a gas cell in which alkali metal atoms are encapsulated;
a light generator configured to irradiate the gas cell with irradiation light having at least two different frequency components; and
a light detector configured to detect transmission light transmitted by the gas cell,
the control method comprising:
determining a resonance frequency of the alkali metal atoms in the gas cell based on a light amount of the detected transmission light; and
controlling, based on a relation among: a temperature of the gas cell, a temperature of the light generator, and the resonance frequency, to adjust the temperature of the gas cell and the temperature of the light generator to a set temperature of the gas cell and a set temperature of the light generator, respectively, which are set so that an amount of change in the resonance frequency when both the temperature of the gas cell and the temperature of the light generator change is smaller than: an amount of change in the resonance frequency when the temperature of the gas cell changes, or an amount of change in the resonance frequency when the temperature of the light generator changes.

8. The control method according to claim 7, comprising:

setting a plurality of combinations of the temperature of the gas cell and the temperature of the light generator, determining a resonance frequency of the alkali metal atoms in the gas cell for each of the plurality of combinations, extracting, based on the relation and from the plurality of combinations, a combination in which an amount of change in the resonance frequency due to a change in the temperature of the gas cell and an amount of change in the resonance frequency due to a change in the temperature of the light generator have mutually opposite signs, and setting the set temperature of the gas cell and the set temperature of the light generator based on the extracted combination; and adjusting the temperature of the gas cell and the temperature of the light generator to the set temperature of the gas cell and the set temperature of the light generator, respectively.

* * * * *